(12) United States Patent
Melandsø et al.

(10) Patent No.: US 11,450,800 B2
(45) Date of Patent: Sep. 20, 2022

(54) FILM WITH PIEZOELECTRIC POLYMER REGION

(71) Applicant: UNIVERSITETET I TROMSØ—NORGES ARKTISKE UNIVERSITET, Tromsø (NO)

(72) Inventors: Frank Melandsø, Kvaløysletta (NO); Sanat Wagle, Tromsø (NO); Anowarul Habib, Tromsø (NO)

(73) Assignee: UNIVERSITETET I TROMSØ—NORGES ARKTISKE UNIVERSITET, Tromsø (NO)

( * ) Notice: Subject to any disclaimer, the term of this patent is extended or adjusted under 35 U.S.C. 154(b) by 0 days.

(21) Appl. No.: 16/805,301

(22) Filed: Feb. 28, 2020

(65) Prior Publication Data
US 2020/0373477 A1    Nov. 26, 2020

Related U.S. Application Data

(63) Continuation of application No. 16/340,614, filed as application No. PCT/GB2017/053040 on Oct. 6, 2017, now Pat. No. 10,797,222.

(30) Foreign Application Priority Data

Oct. 10, 2016   (GB) ...................................... 1617171

(51) Int. Cl.
*H01L 41/083*        (2006.01)
*B32B 27/06*        (2006.01)
(Continued)

(52) U.S. Cl.
CPC ............ *H01L 41/083* (2013.01); *B32B 27/06* (2013.01); *C08L 27/12* (2013.01); *H01L 41/00* (2013.01);
(Continued)

(58) Field of Classification Search
CPC ....... H01L 41/27; H01L 41/00; H01L 41/053; H01L 41/08; H01L 41/083; H01L 41/16;
(Continued)

(56) References Cited

U.S. PATENT DOCUMENTS

| 4,413,202 A | 11/1983 | Krempl et al. |
| 5,089,739 A | 2/1992 | Takahashi et al. |

(Continued)

FOREIGN PATENT DOCUMENTS

| CA | 1 183 595 | 3/1985 |
| CN | 101714608 A | 5/2010 |

(Continued)

OTHER PUBLICATIONS

European Patent Office, Communication pursuant to Article 94(3) EPC, issued in related EP Application No. 17 794 039.2 dated Jul. 7, 2020, 5 pages.

(Continued)

*Primary Examiner* — Eduardo A Rodela
(74) *Attorney, Agent, or Firm* — Fish & Richardson P.C.

(57) ABSTRACT

A film comprising a piezoelectric polymer has an upper surface and a lower surface. The film has an active region comprising the piezoelectric polymer, which extends from the upper surface of the film to the lower surface of the film. The film also comprises an adhesive sheet, which defines part of the upper or lower surface of the film. Circuit sheets may be bonded to the upper and lower surfaces in a lamination process to produce a laminated piezoelectric device.

18 Claims, 3 Drawing Sheets

(51) Int. Cl.

| | |
|---|---|
| *C08L 27/12* | (2006.01) |
| *H01L 41/053* | (2006.01) |
| *H01L 41/187* | (2006.01) |
| *H01L 41/193* | (2006.01) |
| *H01L 41/29* | (2013.01) |
| *H04R 17/00* | (2006.01) |
| *H01L 41/23* | (2013.01) |
| *H01L 41/45* | (2013.01) |
| *H01L 41/37* | (2013.01) |
| *H01L 41/00* | (2013.01) |
| *H01L 41/08* | (2006.01) |
| *H01L 41/16* | (2006.01) |
| *H01L 41/27* | (2013.01) |
| *B32B 15/04* | (2006.01) |

(52) U.S. Cl.
CPC ............ *H01L 41/053* (2013.01); *H01L 41/08* (2013.01); *H01L 41/16* (2013.01); *H01L 41/187* (2013.01); *H01L 41/193* (2013.01); *H01L 41/23* (2013.01); *H01L 41/27* (2013.01); *H01L 41/29* (2013.01); *H01L 41/37* (2013.01); *H01L 41/45* (2013.01); *H04R 17/005* (2013.01); *B32B 15/043* (2013.01); *B32B 2250/03* (2013.01); *B32B 2307/20* (2013.01); *B32B 2310/14* (2013.01); *B32B 2405/00* (2013.01)

(58) Field of Classification Search
CPC ..... H01L 41/187; H01L 41/193; H01L 41/23; H01L 41/29; H01L 41/37; H01L 41/45; B23B 27/06; B23B 15/043; B23B 2250/03; B23B 2307/20; B23B 2310/14; B23B 2405/00; C08L 27/12
See application file for complete search history.

(56) References Cited

U.S. PATENT DOCUMENTS

| | | | |
|---|---|---|---|
| 5,288,551 A | 2/1994 | Sato et al. | |
| 7,049,165 B2* | 5/2006 | Oguchi | B81C 1/00579 |
| | | | 148/DIG. 12 |
| 9,786,450 B2* | 10/2017 | Wada | H01L 41/1132 |
| 10,797,222 B2 | 10/2020 | Melandso et al. | |
| 2004/0263483 A1* | 12/2004 | Aufderheide | G06F 3/043 |
| | | | 345/173 |
| 2012/0274708 A1 | 11/2012 | Nystrom et al. | |
| 2013/0018266 A1 | 1/2013 | Nishikubo et al. | |
| 2014/0159542 A1 | 6/2014 | Lee et al. | |
| 2014/0218663 A1 | 8/2014 | Stahl et al. | |
| 2015/0173714 A1 | 6/2015 | Park | |
| 2015/0292963 A1 | 10/2015 | Murata et al. | |
| 2015/0311012 A1 | 10/2015 | Wada et al. | |
| 2015/0346881 A1 | 12/2015 | Watazu | |
| 2015/0380636 A1* | 12/2015 | Fujisawa | C08K 3/36 |
| | | | 310/334 |
| 2018/0120942 A1 | 5/2018 | Lee et al. | |
| 2019/0319181 A1 | 10/2019 | Melandsø et al. | |
| 2019/0348596 A1* | 11/2019 | Pelssers | H01L 41/183 |
| 2019/0354222 A1* | 11/2019 | Frescas | H03K 17/96 |

FOREIGN PATENT DOCUMENTS

| | | |
|---|---|---|
| EP | 2 919 249 | 9/2015 |
| JP | S57-126125 | 8/1982 |
| JP | 2000-507392 | 6/2000 |
| JP | 2001-250993 | 9/2001 |
| JP | 2008-122215 | 5/2008 |
| JP | 2014-529752 | 11/2014 |
| JP | WO 2016/002459 | 4/2017 |
| JP | WO 2016/027667 | 6/2017 |
| KR | 10-2016-0031170 | 3/2016 |
| WO | WO 95/20827 | 8/1995 |
| WO | WO 2013/004541 | 1/2013 |
| WO | WO 2014/073628 | 5/2014 |
| WO | WO 2015/077200 | 5/2015 |
| WO | WO 2015/129061 | 9/2015 |

OTHER PUBLICATIONS

International Search Report and Written Opinion for corresponding PCT Appl No. PCT/GB2017/053040, dated Jan. 18, 2018.
Yu et al., "Flexible Piezoelectric Tactile Sensor Array for Dynamic Three-Axis Force Measurement," Sensors 2016, 16, 819.
International Preliminary Report on Patentability in International Appln. No. PCT/GB2017/053040, dated Apr. 16, 2019, 7 pages.
Ketterling et al., "Design and Fabrication of a 40-MHz Annular Array Transducer," IEEE Transactions on Ultrasonics, Ferroelectrics, and Frequency Control, Apr. 2005, 52(4):672-681.
Ketterling et al., "High-frequency piezopolymer transducers with a copper-clad polyimide backing layer," IEEE Trans Ultrason Ferroelectr Freq Control, Jul. 2006, 53(7):1376-1380.
Smolorz et al., "Focusing PVDF Transducers for Acoustic Microscopy," Res Nondestr Eval, 1996, 7:195-201.
Takahashi, "Properties and characteristics of P((VDF/TrFE) transducers manufactured by a solution casting method for use in the MHz-range ultrasound in air," Ultrasonics, 2012, 52(2012):422-426.
Zou et al., "Wideband high-frequency line-focus PVDF transducer for materials characterization," Ultrasonics, 2003, 41(2003):157-161.

* cited by examiner

FILM WITH PIEZOELECTRIC POLYMER REGION

CROSS-REFERENCE TO RELATED APPLICATIONS

The present application is a continuation of, and claims benefit under 35 USC 120 to, U.S. application Ser. No. 16/340,614, filed Apr. 9, 2019, which is a national stage of and claims priority under 35 U.S.C. § 371 to PCT Application No. PCT/GB2017/053040, filed on Oct. 6, 2017, which claims priority to Great British Application No. 1617171.2, filed on Oct. 10, 2016. The contents of these priority applications are hereby incorporated by reference in their entirety.

This invention relates to laminated piezoelectric devices, and to components and methods for manufacturing the same.

Piezoelectric materials generate a voltage when subjected to mechanical stress, and have many applications such as in microphones and sensors. They can also deform when subjected to an externally-applied voltage, and so can be used as loudspeakers, motors, actuators, etc. Some piezoelectric materials also exhibit a pyroelectric effect, enabling them to be used for applications such as infrared detectors. Piezoelectric materials are used across a wide range of industries, including manufacturing, automotive, telecommunications and medical instruments.

Piezoelectric devices traditionally employ bulk crystal or ceramic materials that can exhibit a piezoelectric effect. More recently, however, polymers such as polyvinylidene fluoride (PVDF) and the copolymer poly(vinylidenefluoride-co-trifluoroethylene) (P(VDF-TrFE)) have increasingly been used. Unlike ceramics, these piezoelectric polymers are flexible. They can also be processed using techniques such as spraying, spin-coating, and dip-coating. For acoustic applications, they provide a good acoustic match to many other materials such as water, biological tissue, and polymers. Similar advantages can also be provided by piezo-composite materials, which incorporate piezo-ceramic particles into a polymer (e.g., in powdered form), which is not necessarily a piezoelectric polymer (e.g., an epoxy resin). For the purposes of this patent application, piezoelectric ceramic-polymer composites should be considered to be included within the general term "piezoelectric polymer".

Piezoelectric polymers are well suited to micro-fabrication. Such devices can be made to be flexible, making them well suited for various sensing applications, and for incorporating into flexible circuits.

Most of today's devices for piezoelectric sensors and transducers use conductive electrode materials that are attached directly to the piezoelectric material, or that are attached to an external circuit.

An example of direct attachment is a commercially-available metallized piezo-film sheet, which consist of a PVDF film covered top and/or bottom with metal, such as a compliant silver ink, or one or more sputtered metals. These metal layers may be etched to create electrodes for connection to a circuit, as described in "Flexible Piezoelectric Tactile Sensor Array for Dynamic Three-Axis Force Measurement" by Ping Yu et al., Sensors 16, no. 6: 819. However, such etching is complex and involves chemicals that are environmentally harmful. Connecting an electronic circuit to the electrodes (e.g., by wire-bonding or a conductive adhesive) is not straightforward due to the temperature limitations of the PVDF material.

Alternatively, an external circuit can be attached to a piezoelectric material during the manufacturing process. A thin dielectric adhesive layer can be used to bond the piezoelectric material to the circuit material or electrode. This adhesive layer has to be thin, in order to avoid a significant reduction of the electric field inside the piezoelectric material. The adhesive may also need to match the acoustic impedance of the other materials. These requirements can be challenging to meet in a production process.

The paper "Properties and characteristics of P(VDF/TrFE) transducers manufactured by a solution casting method for use in the MHz-range ultrasound in air" by Takahashi, Ultrasonics 52 (2012) 422-426, identifies challenges of adhesive bonding. It describes an alternative approach in which P(VDF/TrFE) is cast directly onto an aluminium backing plate.

However, the present invention takes a different approach.

From a first aspect, the invention provides a film having an upper surface and a lower surface, the film comprising (i) an active region comprising a piezoelectric polymer, the active region having a thickness that extends from the upper surface of the film to the lower surface of the film, and (ii) an adhesive sheet, wherein the adhesive sheet defines part of the upper or lower surface of the film.

From a second aspect, the invention provides a laminated device comprising a film laminated to a circuit sheet, wherein:
  the film includes (i) an active region comprising a piezoelectric polymer, the active region having a thickness that extends from an upper surface of the film to a lower surface of the film, and (ii) an adhesive sheet, wherein the adhesive sheet defines part of the upper or lower surface of the film;
  the circuit sheet comprises an electrode region adjacent the active region of the film; and
  the circuit sheet is bonded to the adhesive sheet of the film outside the active region.

From a third aspect, the invention provides a method of manufacturing a laminated device comprising a film and a circuit sheet, wherein:
  the film includes (i) an active region comprising a piezoelectric polymer, the active region having a thickness that extends from an upper surface of the film to a lower surface of the film, and (ii) an adhesive sheet, wherein the adhesive sheet defines part of the upper or lower surface of the film; and
  the circuit sheet comprises an electrode region,
the method comprising laminating the circuit sheet to the film by:
  locating the electrode region of the circuit sheet adjacent the active region of the film; and
  bonding the circuit sheet to the adhesive sheet of the film outside the active region.

Thus it will be seen by those skilled in the art that, in accordance with the invention, a piezoelectric-capable film has an adhesive sheet alongside a piezoelectric-capable active region, within the thickness of the film. In some embodiments, one or more regions of piezoelectric polymer may form "islands" within, and through, the adhesive sheet. At least one of the upper and lower surfaces of the film has an active area and a separate adhesive area. This allows a circuit sheet to be bonded to the film without the need to apply any additional adhesive layer between the film and the circuit sheet. In particular, it enables an electrode on the circuit sheet to be in direct contact with the active area or region of the film, without any intervening adhesive layer. This ensures a good and consistent electrical coupling between the electrode and the active region. It can also provide a good acoustical coupling between the electrode and the active region, which may be equally important for certain applications, such as microphones.

The adhesive sheet can also provide a support to the film, facilitating handling of the film. It may also define (on its own, or in combination with other elements) the thickness and size of the film, and of the active region within the film.

The manufacturing method may comprise heating the active region, when laminating the circuit sheet to the film, although this is not essential. This can allow the active region to bond more strongly with the electrode region, e.g., by causing the active region to melt, at least partially, and deform towards the electrode region. Such heating can also improve the uniformity of the active region at an interface with the electrode region. The electrode region preferably touches the active region, and is preferably bonded to it (albeit preferably not using a traditionally-applied adhesive layer).

It will be understood that the piezoelectric polymer may need to be polarised (e.g., by applying a strong electric field across at least part of the active region, under appropriate temperature conditions) before the active region will exhibit a piezoelectric effect. The term "piezoelectric", as used herein, should therefore be understood as including all materials that are capable of giving a piezoelectric effect after appropriate treatment, such as annealing and/or poling.

The film may have any appropriate thickness. However, in some embodiments the film has a thickness (a mean thickness, or a maximum or minimum thickness, or a thickness at one point), of between 1 micrometre and 1 millimetre, or between 5 micrometres and 500 micrometres—e.g., around 50 micrometres. The film is preferably of substantially uniform thickness—for example, having a thickness that deviates by at most +/−1%, +/−10% or +/−50%—over at least 50% or 75% or 90% or 100% of the area of the film. The upper and lower surfaces of the film may have any shape; in some embodiments they may be rectangular. The film may be of any appropriate size—for example, it may have a length of 1, 10 or 100 centimetres or more, and it may have a width of 1, 10 or 100 centimetres or more. The film is preferably flexible. It may have a substantially planar upper and/or lower surface when in a relaxed state. It will be appreciated that terms such as "upper", "lower", "length" and "width" are used for convenience only, and are not intended to limit the film to being used in a horizontal orientation. In some embodiments, the laminated device is flexible.

The film may comprise other materials beyond the adhesive sheet and the piezoelectric polymer. However, in a preferred set of embodiments, the adhesive sheet and the polymer together make up at least 50%, 75%, 90% or 100% of the film by mass, or by surface area on the upper or lower surface of the film.

The active region may have any appropriate shape—e.g., having a square, rectangular or circular cross-section, within the plane of the film when the film is lying flat. The active region preferably extends from the upper surface to the lower surface of the film over at least 90% of the active region, by surface area—and preferably over the whole area. The active region preferably defines an active area of the upper surface of the film; it preferably defines an active area of the lower surface of the film.

The active region is preferably surrounded by the adhesive sheet, for at least part of the thickness of the film. This helps to ensure a reliable connection with the circuit sheet. The adhesive sheet may also thereby provide a frame for the active region, containing the active region during manufacturing and/or use of the film (e.g., when the active region is in a liquid phase). However, it is not essential that the adhesive sheet fully surround the active region.

The adhesive sheet may be substantially homogeneous in its composition, over its depth and/or area.

The adhesive sheet preferably touches the active region. The adhesive sheet may meet the active region at an edge face of the active region within the film. This edge face may extend from the upper surface to the lower surface of the film, although this is not essential. The edge face may be planar; it may be perpendicular to the upper or lower surface of the film.

In one set of embodiments, the adhesive sheet has a thickness that extends from the upper surface of the film to the lower surface of the film. The adhesive sheet would thus define parts of both the upper surface and the lower surface of the film. In such embodiments, the adhesive sheet may extend from the upper surface to the lower surface of the film over at least 90% and preferably the whole of the adhesive sheet—i.e., so that preferably the film consists only or substantially of the adhesive sheet over those areas of the film where the adhesive sheet is present.

Such a film may, for example, be manufactured by cutting or forming a hole through an adhesive sheet, and filling the hole with the piezoelectric polymer, to the same thickness as the adhesive sheet. Alternatively, the adhesive sheet could be deposited or formed around a slab of the piezoelectric polymer. These methods of manufacturing a film are further respective aspects of the invention.

In another set of embodiments, over some or all of the area of the adhesive sheet, the adhesive sheet does not extend from the upper surface of the film to the lower surface of the film. This may be appropriate if it is desired to bond a circuit sheet only to one surface of the film. It can also be advantageous in thicker films (e.g., having a thickness of greater than 50 micrometres) which may require additional structural support. Thus, in some embodiments, the film comprises a second adhesive sheet that defines part of the lower or upper surface of the film, and further comprises a support sheet (e.g., a stiffening sheet)—preferably of a non-adhesive material, and preferably a polymer sheet—that lies between the second adhesive sheet and the first adhesive sheet. The support sheet may be present over the whole area occupied by the first and/or second adhesive sheet, or only a portion of this area. The second adhesive sheet preferably touches the active region. It may meet the active region at an edge face of the active region within the film. It may surround the active region. The first and second adhesive sheets preferably respectively define parts of the upper and lower surfaces of the film.

The active region preferably comprises PVDF or a copolymer of PVDF, such as P(VDF-TrFE). The active region may consist only of a piezoelectric polymer, or only of a piezoelectric polymer and a coupling agent. However, in other embodiments the active region may comprise a mixture of a piezoelectric polymer and at least one other material. The piezoelectric polymer may be, or may comprise, a piezoelectric ceramic-polymer composite (such as PiezoPaint™ by Meggitt A/S).

Manufacturing the laminated device may comprise melting a mixture of a piezoelectric ceramic powder and the polymer.

The manufacturing method may also comprise poling at least part of the active region to polarise the piezoelectric polymer. This may be achieved by applying an electric field across at least a part of the active region and/or heating or cooling the active region, as is known in the art. The electrode region may be used to apply the electric field. It may also be necessary to treat the piezoelectric polymer to activate a phase change—e.g., to change PVDF from an alpha phase to a beta phase. This is referred to as annealing. When using the copolymer P(VDF-TrFE), annealing may be carried out after lamination, by applying heat and pressure for a defined period (e.g., 2-3 hours).

In some embodiments, the active region and/or the electrode region of the circuit sheet may be treated to increase a bonding strength between the active region and the electrode region. Possible treatments include plasma treatment, a chemical primer, or a combination of these. The method of manufacturing may therefore comprise applying a plasma or a chemical primer to the active region or to the electrode region. For instance, the active region and/or the electrode region may be primed with a coupling agent (also called a cross-linking agent), such as a silane. Such treatments can improve the electrical connection between the active region and the electrode region. In some embodiment, the active region may therefore further comprise a coupling agent. The coupling agent is preferably present at a surface of the active region.

It will be appreciated that priming a surface of the active region with a coupling agent, or treating the surface using a plasma, is very different from adding a traditional adhesive layer onto a piezoelectric material, as is known from the prior art. In particular, the cross-linking action of a coupling agent in the polymer of the active region is different from the chemical interaction of a typical adhesive layer-relying on ionic bonding, rather than the Van de Walls forces or mechanical action used by a typical adhesive. A silane coupling agent, for instance, is a single molecule where one end is tailored to bond well to the organic side (e.g., PVDF polymer) while the other side is tailored to bond strongly to the inorganic side (e.g., an electrode material like Au). The coupling agent is therefore preferably deposited with a thickness of only around one or two molecules thick. To achieve such a monolayer, a solution, such as ethanol, is preferably used to wash excess coupling agent from the active region or from the electrode region of the circuit sheet.

The coupling agent is preferably much thinner than a typical adhesive layer would be. Preferably, the surface treatment influences only a few molecular layers around an interface between the active region and the electrode region—e.g. having a thickness of less than 10, 100 or 1,000 nanometres in the laminated device. In particular, a coupling agent layer preferably has a mean or maximum thickness, across the primed active region, of no more than 10, 100, or 1,000 nanometres—for example, around 0.8 nm. Because any surface treatment is so thin, it will cause only a small reduction to the electric field in the active region. By contrast, a traditional epoxy or acrylic adhesive needs to polymerize into very long molecules, which limits how thin such layers can be made. The way that such adhesives are typically applied also makes it difficult to make thing, uniform layers (e.g., of less than a micron).

The adhesive sheet may comprise an epoxy, acrylic or polyimide adhesive. The adhesive may be only partially-cured before lamination. This has been found to facilitate the forming of a void for filling with the piezoelectric polymer during manufacture of the film. The adhesive sheet may comprise Pyralux™ LF Sheet Adhesive from Dupont™.

The circuit sheet may comprise a polymer layer and a metal layer. The electrode region may be formed in the metal layer. It may be substantially the same size and/or shape as the area of the active region on the upper or lower surface of the film, or it may be smaller or larger. A plurality of electrode regions in the circuit sheet may be bonded to the one active region. The circuit sheet may comprise any suitable material. It may comprise a composite such as FR4, commonly used in PCBs. However, in some embodiments, the circuit sheet may comprise an isotropic polymer, preferably one with a high glass transition temperature like polyimide (PI) or polyethyleneimine (PEI). These may be preferred due to their isotropic properties and/or low sound attenuation.

The circuit sheet may comprise a polymer in-fill (e.g., comprising a polyimide adhesive or a high-temperature epoxy) adjacent or surrounding the electrode region. The polymer in-fill may have a surface that is flush with a surface of the electrode region. The polymer in-fill and the electrode region may have an equal thickness. The polymer in-fill may be arranged to bond to the adhesive sheet when the circuit sheet is laminated to the film. Using a polymer in-fill to smooth the surface of the circuit sheet in this way can improve the bonding of the circuit sheet to the film.

The circuit sheet may be laminated to the upper or lower surface of the film. In some embodiments, the laminated device comprises a second circuit sheet, which may be laminated to the opposite surface of the film to the first circuit sheet. The second circuit sheet preferably comprises a second electrode region that is adjacent the active region of the film. The electrode regions of the first and/or second circuit sheets are preferably arranged for connection to one or more electrical circuits, which may include any one or more of: a power supply, a voltage measuring system, an amplifier, an analogue driver, a DAC, an ADC, a processor, a DSP, an ASIC, an FPGA, a resistor, a capacitor, a wire, a socket, an antenna, etc. Some or all of these components may be part of the laminated device (e.g., being part of, or connected to, one or other of the circuit sheets), or they may be separate from the laminated device.

The laminating of the circuit sheet to the film may comprise applying heat and/or pressure to one or both of the circuit sheet and the film, at appropriate levels and for appropriate durations.

The film may comprise a plurality of active regions, each comprising a polymer that has a piezoelectric phase—e.g., 10 or 100 or more active regions. Each of the active regions may have some or all of the same optional features as the active region described above. The active regions are preferably spaced apart from each other within the film—e.g., separated by the adhesive sheet. The active regions may be arranged in a regular grid—e.g., a rectangular array. This is desirable when using the film as a beamforming transducer, such as an array microphone or hydrophone, or an array speaker.

The laminated device may comprise a plurality of films as described herein—e.g., stacked in layers with additional circuit layers in between. It may comprise additional circuit sheets, which may be bonded to the upper and/or lower circuit sheet, and which may be electrically connected to the upper and/or lower circuit sheet using vias.

The laminated device may be, or may form part of, a microphone, a hydrophone, a loudspeaker, an infrared sensor, an actuator, a voltage generator, a pressure sensor, a microbalance, an ultrasonic nozzle, an oscillator, or any other appropriate device. In a preferred set of embodiments, the laminated device is a single or array microphone or loudspeaker—e.g., for receiving and/or transmitting ultrasound.

Using an adhesive-free interface between the piezoelectric material and the electrodes located on external flexible circuits simplifies connection of electrical signals. Standard adhesive (bonding) materials can be used outside the active piezoelectric domains. This is believed to have advantages in terms of, for example, increasing the overall bond strength and simplifying connection between different circuit layers (e.g. by using known solutions for via connections). The adhesive materials can be purchased in various thicknesses, which can then also act as "stoppers" for the lamination process, to control the final thickness of the piezoelectric film. This can simplify the lamination process by not requiring external "stopping" parts to be used in the lamination tool, and by making control of the temperature and pressure parameters less critical.

Features of any aspect or embodiment described herein may, wherever appropriate, be applied to any other aspect or embodiment described herein. Where reference is made to different embodiments or sets of embodiments, it should be understood that these are not necessarily distinct but may overlap.

Certain preferred embodiments of the invention will now be described, by way of example only, with reference to the accompanying drawings, in which.

The drawings are not to scale. In particular, the thickness (height) of the layers has been greatly exaggerated.

Figure 1:
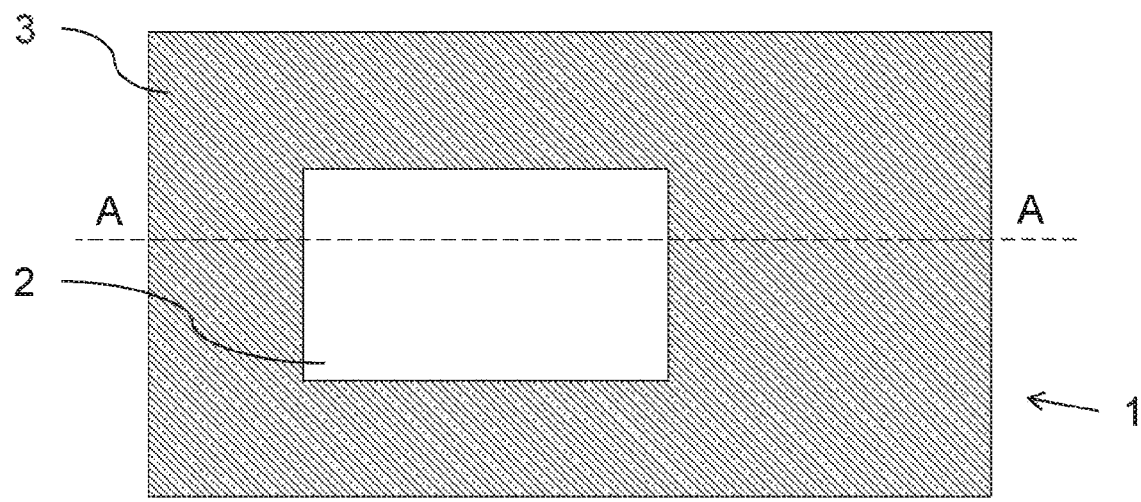
FIG. 1 is a top view of a piezoelectric-capable film embodying the invention.

FIG. 1 shows a flexible, rectangle of film 1 in which a thin rectangle of polyvinylidene fluoride (PVDF) 2 is surrounded by an adhesive sheet 3. The rectangle of film 1 shown in FIG. 1 may be the entire film, or it may be part of a larger film, which may contain multiple PVDF rectangles—e.g., a regularly-spaced rectangular grid of such rectangles.

Figure 2:
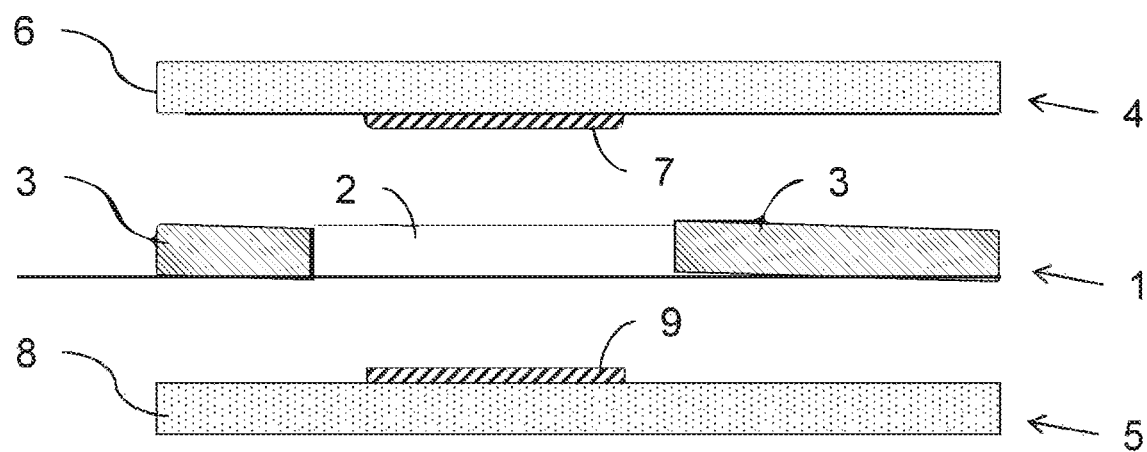
FIG. 2 is an exploded cross-sectional side view of the film, in combination with an upper circuit sheet and a lower circuit sheet.

FIG. 2 shows a side view of the film 1, along the line A-A in FIG. 1. The rectangle of PVDF 2 and the adhesive sheet 3 have the same thickness as each other, which is also the thickness of the film 1. This thickness may be from 5 to 50 micron. The film 1 may be fabricated by creating a uniform rectangular sheet of partially-cured epoxy or acrylic adhesive, and then cutting the rectangle out—e.g., using milling, laser cutting, or die cutting—and replacing it with the PVDF 2.

A flexible upper circuit sheet 4 and a flexible lower circuit sheet 5 are shown above the film 1 and below the film 1, respectively, lying parallel with the film 1. These sheets 4, 5 are shown in a spaced-apart relationship with the film 1, for ease of viewing. However, in reality, these circuit sheets 4, 5 will be placed in contact with the film 1 prior to lamination, and will be bonded to the film 1 after lamination.

The upper circuit sheet 4 has a polymer layer 6, which may be polyimide (PI) or polyethyleneimine (PEI). A patterned metal layer has been deposited or etched on the underside of the polymer layer. This metal layer includes a rectangular electrode 7, which is aligned with (although smaller than) the PVDF rectangle 2 in the film 1.

The lower circuit sheet 5 has a polymer layer 8, which may be PI or PEI. A patterned metal layer has been deposited or etched on the upper face of the polymer layer. This metal layer includes a rectangular electrode 9, which is aligned with the metal rectangle 7 of the upper circuit sheet 4.

Figure 3:
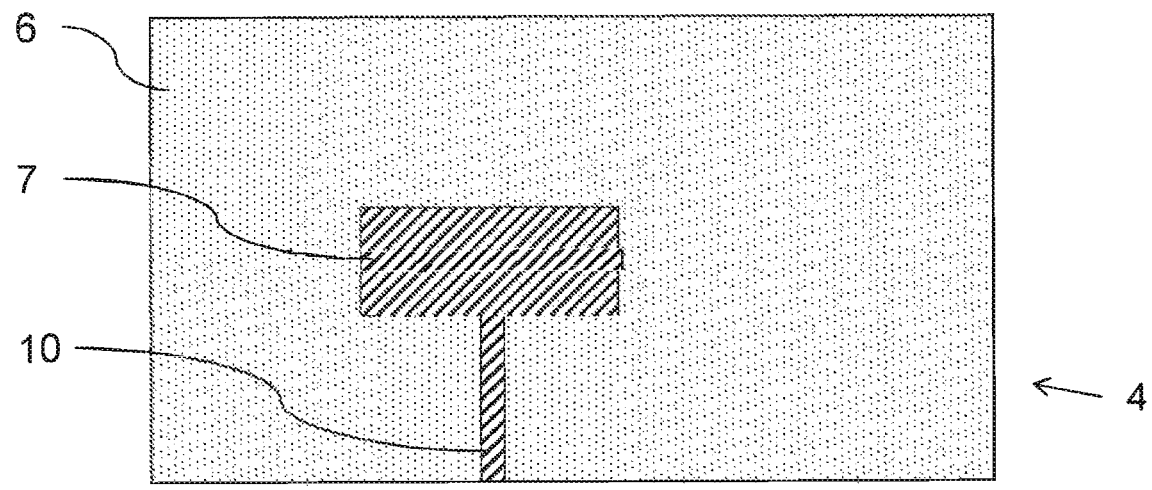
FIG. 3 is a bottom view of the upper circuit sheet.

FIG. 3 shows the underside of the upper circuit sheet 4. In addition to the electrode 7, the patterned metal layer may provide other circuit features such as a wire 10 for connecting the electrode 7 to an electrical circuit which may include components that are located off the film 1.

Figure 4:
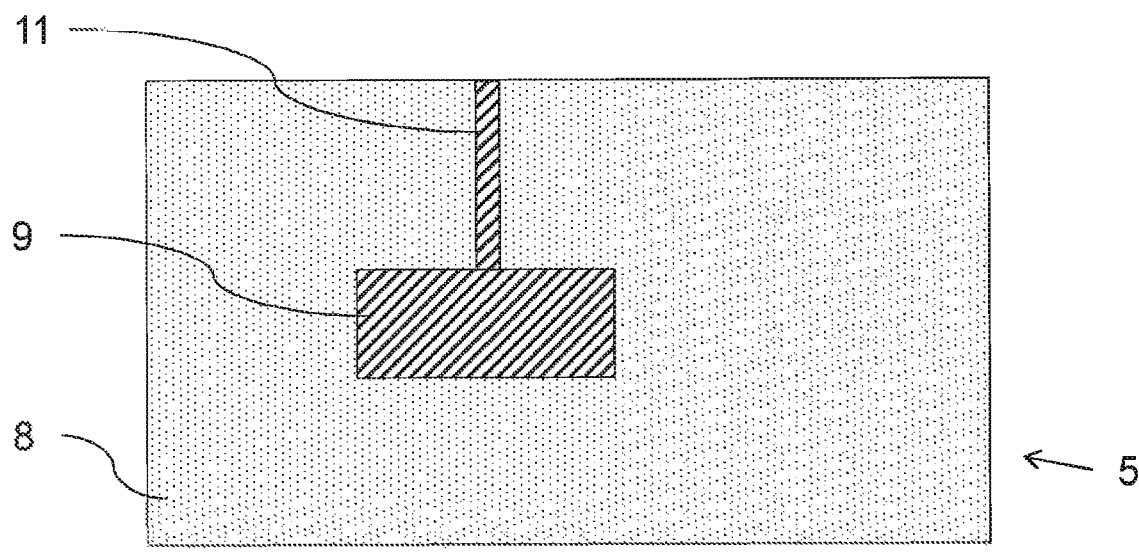
FIG. 4 is a top view of the lower circuit sheet.

FIG. 4 shows the top side of the lower circuit sheet 5. This may similarly include other circuit features such as a wire 11 for connecting the electrode 9 to the same electrical circuit as the electrode 7 on the upper circuit sheet 4.

During manufacture, the film 1 is sandwiched between the upper circuit sheet 4 and the lower circuit sheet 5, and heat and pressure are applied—e.g., by a heated press or roller. This causes the polymer layers 6, 8 of the circuit sheets 4, 5 to stick to the upper and lower faces, respectively, of the adhesive sheet 3 of the film 1, everywhere except adjacent the rectangle of PVDF 2. Instead, the electrodes 7, 9 will contact the rectangle of PVDF 2 and will make physical and electrical contact by a combination of mechanisms.

First, tension in the polymer layers 6, 8 of the circuit sheets 4, 5, once they are adhered to the adhesive sheet 3, will force the electrodes 7, 9 onto the rectangle of PVDF 2.

Secondly, during lamination, sufficient heat is applied to the PVDF 2 sufficient to cause it to melt or to near melting point; as the PVDF 2 cools, it will conform closely to the surface of the electrodes 7, 9, providing good contact.

Thirdly, prior to lamination, the exposed surfaces of the electrodes 7, 9 and/or the PVDF rectangle 2 may be treated with a plasma and/or a chemical primer, such as a silane, to improve the bonding. This surface treatment preferably influences only a few molecular layers around the electrode-PVDF interface, to minimize the electric field reduction in the PVDF 2.

After lamination, the electrodes 7, 9 are used to apply an electrical field across the rectangle of PVDF 2 in order to polarise the PVDF 2 so as to cause it to become piezoelectric. Thereafter, the laminated device may be used as, or incorporated into, a microphone, loudspeaker, actuator, or other component or circuit, as required.

In other embodiments, instead of PVDF 2, a different type of piezoelectric material may be used in the film 1, so long as it can be adapted to the temperature and pressure required for the bonding procedure, and embedding between the flexible circuits 4, 5. Examples of applicable piezoelectric material are PVDF-TrFE), other copolymers of PVDF, and composites of ceramic powder mixed with one or more polymers. The piezoelectric material could also have different initial forms when it is inserted in a lamination press—for example, being a fluid or gel mixed with a solvent. It might instead be in the solid phase—e.g., in the form of a pellet, a powder or a film. As already mentioned, during the lamination, the piezoelectric material should either be in a melted phase or near melting at least during a part of the lamination cycle, where it can deform toward the flexible circuits 4, 5 and electrodes 7, 9 to provide a sufficient strong bonding as well as uniformity to the facing materials.

Figure 5:
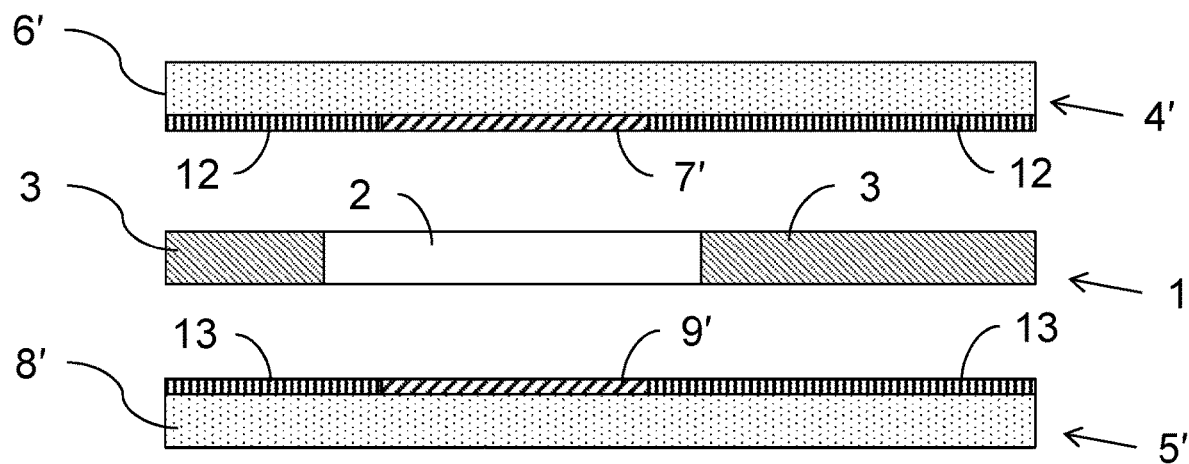
FIG. 5 is an exploded cross-sectional side view of a first variant having a film and two alternative circuit sheets.

FIG. 5 shows a variant embodiment in which the same film 1 is sandwiched between alternative circuit sheets 4', 5'. The upper circuit sheet 4' is the same as the upper circuit sheet 4 of FIG. 1 except that air gaps in the patterned metal layer, including the rectangular electrode 7', have been filled in with a filling material 12 to provide a planar lower face to the upper circuit sheet 4'. This can improve the bonding to the upper face of the film 1. Similarly, the lower upper circuit sheet 5' is the same as the lower circuit sheet 5 of FIG. 1 except that air gaps in the patterned metal layer, including the rectangular electrode 9', have been filled in with a filling material 13 to provide a planar upper face to the lower circuit sheet 5'.

Figure 6:
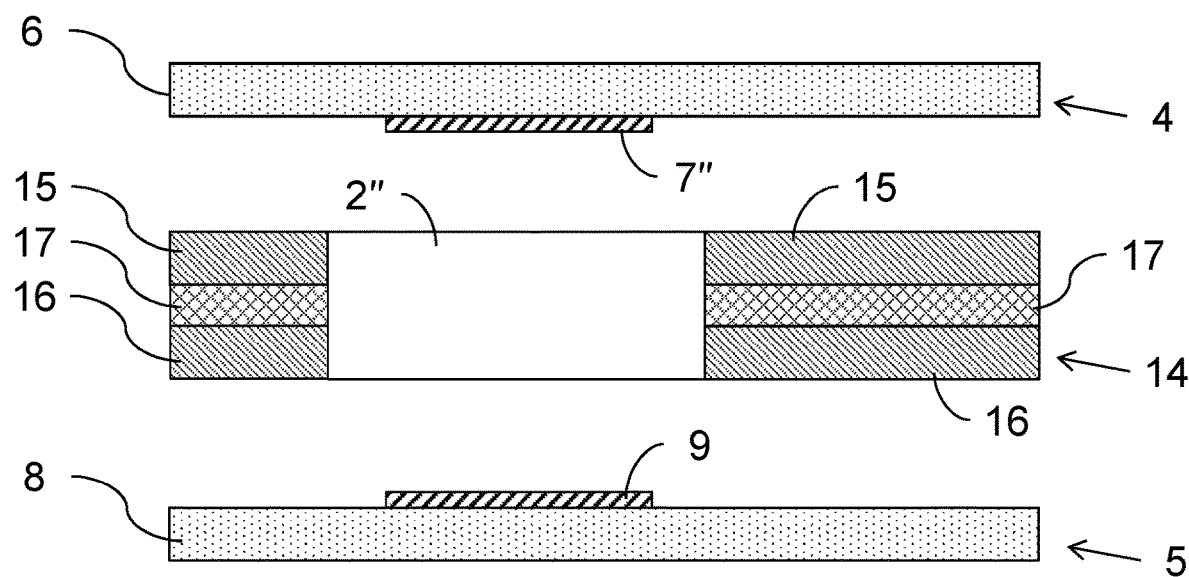
FIG. 6 is an exploded cross-sectional side view of a second variant having two circuit sheets and an alternative film.

FIG. 6 shows a variant embodiment in which an alternative film 14 structure is sandwiched between the upper and lower circuit sheets 4, 5. This variant is particularly suitable where a thicker piezoelectric region is desired—e.g., greater than 50 microns thick. A rectangle of PVDF 2" is surrounded by a three-layered structure comprising an upper adhesive sheet 15, a lower adhesive sheet 16, and—sandwiched between these—a stiffening sheet 17 made of a suitable flexible polymer. The film 14 may be formed by laminated complete rectangles of two adhesive sheets with a stiffening sheet, and then cutting out a rectangular hole, to be filled with PVDF 2". The variant has additional stiffness, which may simplify handling of the film 14.

It will be appreciated by those skilled in the art that the invention has been illustrated by describing one or more specific embodiments thereof, but is not limited to these embodiments; many variations and modifications are possible, within the scope of the accompanying claims.

The invention claimed is:

1. A laminated device comprising a film laminated to a circuit sheet, wherein:
the film has an upper surface and a lower surface, the film comprising (i) an active region comprising a piezoelectric polymer, the active region having a thickness that extends from the upper surface of the film to the lower surface of the film, and (ii) an adhesive sheet, wherein the adhesive sheet defines part of the upper or lower surface of the film;
the circuit sheet comprises an electrode region adjacent the active region of the film and a polymer in-fill adjacent or surrounding the electrode region; and
the circuit sheet is bonded to the adhesive sheet of the film outside the active region.

2. The laminated device as claimed in claim 1, wherein the active region at least one of:
extends from the upper surface to the lower surface of the film over the whole active region; and
is surrounded by the adhesive sheet.

3. The laminated device as claimed in claim 1, wherein the adhesive sheet meets the active region at an edge face of the active region within the film.

4. The laminated device as claimed in claim 1, wherein the adhesive sheet has a thickness that extends from the upper surface of the film to the lower surface of the film.

5. The laminated device as claimed in claim 1, wherein, over some or all of the area of the adhesive sheet, the adhesive sheet does not extend from the upper surface of the film to the lower surface of the film.

6. The laminated device as claimed in claim 5, wherein the film comprises a second adhesive sheet that defines part of the lower or upper surface of the film, and further comprises a non-adhesive sheet that lies between the second adhesive sheet and the first adhesive sheet.

7. The laminated device as claimed in claim 6, wherein the second adhesive sheet at least one of:
meets the active region at an edge face of the active region within the film; and
surrounds the active region.

8. The laminated device as claimed in claim 6, wherein the first and second adhesive sheets define parts of the upper and lower surfaces of the film, respectively.

9. The laminated device as claimed in claim 1, wherein the active region comprises at least one of:
PVDF or a copolymer of PVDF; and
a piezoelectric ceramic-polymer composite.

10. The laminated device as claimed in claim 1, wherein the adhesive sheet or sheets comprise an epoxy, acrylic or polyimide adhesive.

11. The laminated device as claimed in claim 1, wherein the film comprises a plurality of spaced-apart active regions, each comprising a piezoelectric polymer.

12. The laminated device as claimed in claim 1, wherein the circuit sheet comprises a polymer layer and a metal layer, with the electrode region formed in the metal layer.

13. The laminated device as claimed in claim 12, wherein the polymer in-fill is provided adjacent the electrode region in the metal layer.

14. The laminated device as claimed in claim 1, comprising a second circuit sheet laminated to the film, with the film located between the first circuit sheet and the second circuit sheet.

15. A method of manufacturing a laminated device as claimed in claim 1, the method comprising laminating the circuit sheet to the film by:
locating the electrode region of the circuit sheet adjacent the active region of the film; and
bonding the circuit sheet to the adhesive sheet of the film outside the active region.

16. The method of manufacturing a laminated device as claimed in claim 15, further comprising at least one of:
heating the active region so as to cause the active region to melt, at least partially, and so increase bonding between the electrode region and the active region;
poling and/or annealing at least part of the active region;
applying a plasma to the active region and/or to the electrode region;
priming the active region and/or the electrode region with a coupling agent; and
laminating a second circuit sheet to the film, such that the film is located between the first circuit sheet and the second circuit sheet.

17. The laminated device as claimed in claim 1, wherein the polymer in-fill has a surface that is flush with a surface of the electrode region, and/or wherein the polymer in-fill and the electrode region have an equal thickness.

18. The laminated device as claimed in claim 1, wherein the polymer in-fill is arranged to bond to the adhesive sheet when the circuit sheet is laminated to the film.

* * * * *